United States Patent
Kim et al.

(10) Patent No.: US 7,040,739 B2
(45) Date of Patent: May 9, 2006

(54) FLEXIBLE PRINTED CIRCUIT BOARD

(75) Inventors: Jeong-Seon Kim, Suwon (KR); Myung-Song Jung, Gunpo (KR); Jae-cheal Lee, Suwon (KR); Seo-hyun Cho, Seongnam (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 258 days.

(21) Appl. No.: 10/706,953

(22) Filed: Nov. 14, 2003

(65) Prior Publication Data

US 2004/0095437 A1 May 20, 2004

(30) Foreign Application Priority Data

Nov. 14, 2002 (KR) ...................... 10-2002-0070908

(51) Int. Cl.
*B41J 2/05* (2006.01)
*B41J 2/14* (2006.01)
(52) U.S. Cl. .......................... 347/58; 347/50
(58) Field of Classification Search ................... 347/20, 347/50, 54, 56, 57, 58; 257/734; 438/21; 174/254
See application file for complete search history.

(56) References Cited

U.S. PATENT DOCUMENTS 6,183,066 B1  2/2001  Tamura et al. ................ 347/58
6,652,072 B1  11/2003  Browning et al. ............ 347/50

*Primary Examiner*—Shih-Wen Hsieh
(74) *Attorney, Agent, or Firm*—Staas & Halsey LLP

(57) ABSTRACT

A flexible printed circuit board connected to a printer head having at least one heater discharging ink, the flexible printed circuit board including: at least one voltage supplying terminal selectively supplying an operating voltage to the at least one heater in response to receiving a printing command signal from a printer; at least one first cable connected at each end to the at least one voltage supplying terminal and at least one first bonding pad, respectively, transferring the operating voltage to the at least one heater; at least one grounded terminal; and at least one second cable connected at each end to the at least one grounded terminal and at least one second bonding pad, respectively, in which the at least one second cable is divided into at least two portions at a predetermined position and a first portion of the at least two divided portions is provided along one side of the at least one first cable, and a second portion of the at least two divided portions is provided along the other side of the first cable.

15 Claims, 4 Drawing Sheets

FLEXIBLE PRINTED CIRCUIT BOARD

CROSS-REFERENCE TO RELATED APPLICATIONS

This application claims the benefit of Korean Application No. 2002-70908, filed Nov. 14, 2002, in the Korean Intellectual Property Office, the disclosure of which is incorporated herein by reference.

BACKGROUND OF THE INVENTION

1. Field of the Invention

The present invention relates to a flexible printed circuit board, and, more particularly, to a flexible printed circuit board connected to a printer head, which provides improvement in printing speed through impedance reduction.

2. Description of the Related Art

In general, printing machines, such as an inkjet printer or a duplicating machine, form an image using an ink cartridge. The ink cartridge emits, to a printing paper, a monochromatic or color ink stored in the ink cartridge through a printer head according to a printing command signal, i.e., according to a heater selection signal provided from the printing machine. The printer head is a substrate for firing ink, and is formed on a part of the ink cartridge.

Meanwhile, there is a need for a device that transfers a heater selection signal provided from the printing machine to the printer head, and a flexible printed circuit (FPC) board is generally used to transfer this heater selection signal. An FPC board is a printed circuit board that electrically connects the printing machine and the printer head.

The following description will be made using an inkjet printer as an example for the printing machine.

FIG. 1 is a plan view schematically showing a part of an FPC board connected with the printer head as in the related art.

Referring to FIG. 1, a conventional FPC board 100 includes a plurality of voltage supplying terminals 110, a plurality of grounded terminals 120, a plurality of signaling terminals 130, a plurality of first cables 115, and a plurality of second cables 125. Here, the voltage supplying terminals 110, the grounded terminals 120, and the signaling terminals 130 are represented by the reference numerals P, G, and S, respectively.

The voltage supplying terminals 110 are operated for each color, and supply a voltage according to a printing command signal received from the inkjet printer. The grounded terminals 120 are used for grounding the FPC board 100, and one voltage supplying terminal 110 has at least two grounded terminals 120. The signaling terminals 130 are used for performing relevant functions according to a controlling signal received from the inkjet printer.

The first cable 115 is a wiring for electrically connecting the voltage supplying terminal 110 to the first bonding pad 152 on the printer head 150, which will be described in the following. The second cable 125 is a wiring for electrically connecting the grounded terminal 120 to the second bonding pad 154 on the printer head 150. A wiring (not shown) for connecting the signaling terminal 130 to the printer head 150 will be omitted.

Also, the printer head 150, having a plurality of heaters (not shown) to discharge ink, is provided on one side of the ink cartridge, and has a plurality of the first bonding pads 152 and the second bonding pads 154. A description and drawing of other elements provided to the printer head 150, such as an FET (Field Effect Transistor) element, will be omitted.

A plurality of the first and second bonding pads 152, 154 are distributed and provided at both sides of the printer head 150, i.e., to the first side edge and the second side edge. The first and the second bonding pads 152, 154, made of aluminum, are terminals which are bonded to the leads, respectively, of the first and the second cables 115, 125 by ultrasonic fusing.

The printer head 150, provided at one side of the ink cartridge, fires ink according to a printing command signal received from the inkjet printer through the FPC board 100.

If a printing command signal is received, an impedance formed at the heater (not shown) connected with the voltage supplying terminal 110 (e.g. Y1-P), and at least two grounded terminals 120 (e.g. Y1-G), is influenced by a resistance, a capacitance, and an inductance, but is mostly greatly influenced by the inductance. Namely, impedance increases as inductance value increases.

Table 1 shows inductance values measured at the FPC board 100 connected with the printer head of FIG. 1.

TABLE 1

| Color | Inductance (unit: nH) |
|---|---|
| Y1 | 36.8 |
| Y2 | 21.0 |
| M1 | 38.1 |
| M2 | 22.9 |
| C1 | 35.0 |
| C2 | 21.3 |

Referring to Table 1 and FIG. 1, Y is a group for realizing yellow, M for magenta, C for cyan, and 1, 2 in the 'color' block of the Table 1 indicates that color groups Y, M, C are connected to the first side and the second side of the printer head 150, respectively. Also, Y1 consists of one voltage supplying terminal Y1-P and two grounded terminals Y1-G, for realizing yellow color. As the construction of Y2, M1, M2, C1, C2 is similar to that of Y1, a detailed description thereof will be omitted.

As in FIG. 1, in the case that the first cable 115 and the second cable 125 at a predetermined group Y1 are separated from each other by more than a predetermined distance and provided to the FPC board 100, or in the case that the first and the second cables 115, 125 are nearly the same in their diameter, the conventional FPC board 100 has high inductance values as shown in Table 1.

Also, the conventional inkjet printer requires maximum data transmission frequency of 10 MHz–100 MHz for high speed printing. Namely, if printing is performed with the use of a high frequency wave at the status of high inductance of the FPC board 100 as shown in Table 1, the impedance increases and a current supply loss subsequently occurs. Accordingly, the FET element (not shown) for operating the printer head 150 cannot receive the necessary current amount, so that the heater (not shown) is not properly heated and printing speed may not be increased, or may be delayed.

SUMMARY OF THE INVENTION

To solve the above and/or other problems, it is, therefore, an aspect of the present invention to provide a flexible printed circuit board capable of reducing inductance value among components constituting impedance formed on the substrate.

Additional aspects and/or advantages of the invention will be set forth in part in the description which follows and, in part, will be obvious from the description, or may be learned by practice of the invention.

The foregoing and/or other aspects and advantages are realized by providing a flexible printed circuit board connected to a printer head having at least one heater discharging ink, and at least one set of first and second bonding pads, selectively operating the at least one heater according to a printing command signal received from a printer, the flexible printed circuit board including: at least one voltage supplying terminal selectively supplying an operating voltage to the at least one heater in response to receiving the printing command signal from the printer; at least one first cable connected at each end to the at least one voltage supplying terminal and the at least one first bonding pad, respectively, transferring the operating voltage to the at least one heater; at least one grounded terminal; and at least one second cable connected at each end to the at least one grounded terminal and the at least one second bonding pad, respectively, wherein the at least one second cable is divided into at least two portions at a predetermined position and is provided, in parallel, along both sides of the at least one first cable, separated from the at least one first cable at a predetermined distance.

More specifically, the predetermined distance may be 30 μm–300 μm.

The at least one first and second bonding pads may comprise a plurality of first and second bonding pads distributed in a predetermined ratio and provided to a first side and a second side of the printer head substrate, the first side facing the second side, and wherein the at least one first and second cables comprise a plurality of first and second cables, and the predetermined distance between the first and the second cables connected to the first side of the printer head substrate is different from the predetermined distance between the first and the second cables connected to the second side.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
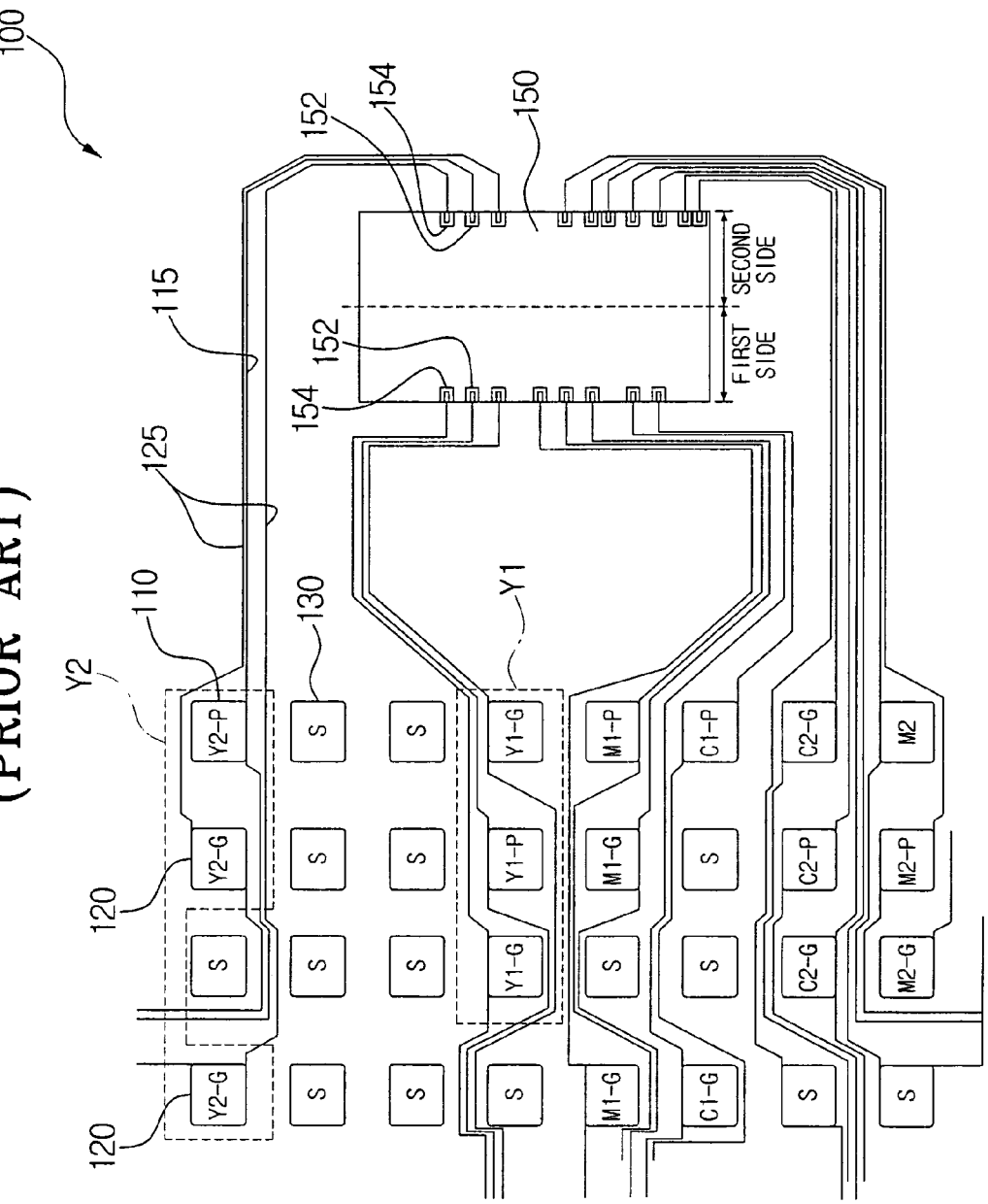
FIG. 1 is a schematic plan view of a part of a flexible printed circuit board connected to a conventional printer head.

Reference will now be made in detail to the embodiments of the present invention, examples of which are illustrated in the accompanying drawings, wherein like reference numerals refer to the like elements throughout. The embodiments are described below to explain the present invention by referring to the figures.

The matters defined in the description, such as the detailed construction and elements, are only provided to assist in a comprehensive understanding of the invention. Thus, it is apparent that the present invention can be carried out without those defined matters. Also, well-known functions or constructions are not described in detail, since they would obscure the invention in unnecessary detail.

Figure 2A:
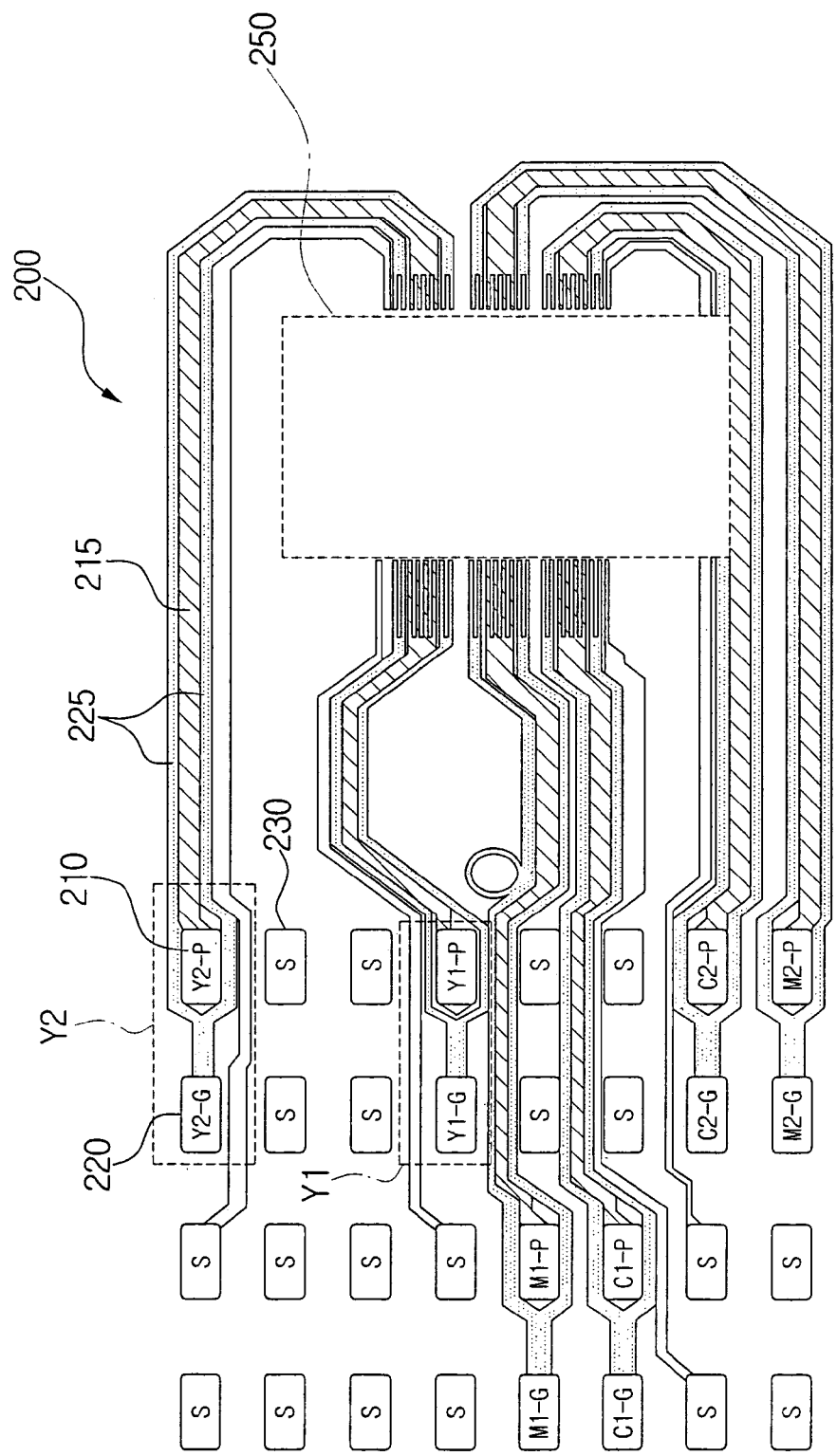
FIG. 2A is a schematic plan view of a part of a flexible printed circuit board connected to a printer head according to an embodiment of the present invention.
Figure 2B:
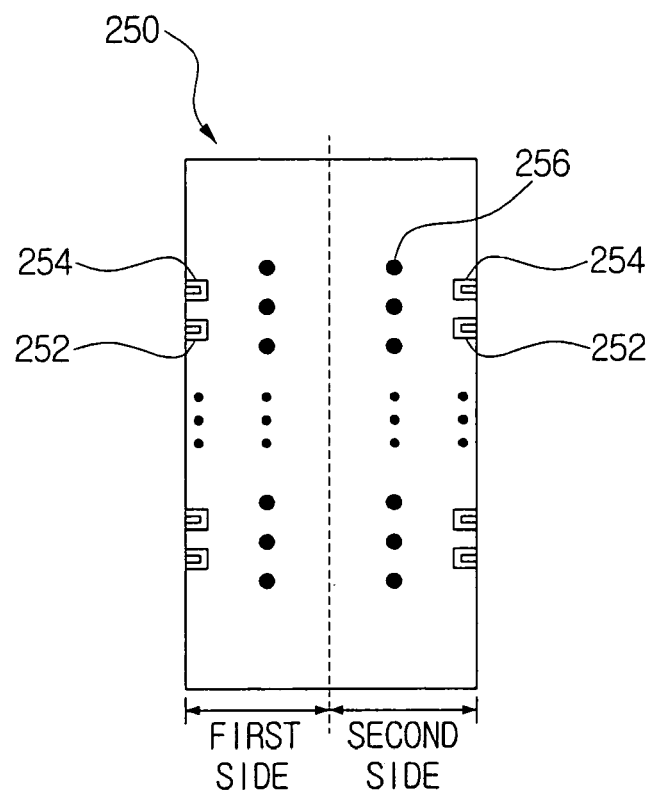
FIG. 2B is a drawing schematically showing a printer head connected to a flexible printed circuit board of FIG. 2A.

FIG. 2A is a schematic plan view of a part of a flexible printed circuit board connected to a printer head according to an embodiment of the present invention, and FIG. 2B is a drawing schematically showing the printer head connected to the flexible printed circuit board of FIG. 2A.

The FPC board suggested by the present invention is a substrate for transferring a printing command signal, i.e., transferring a heater selection signal received from a printer machine, to a printer head. Also, the printer head fires ink corresponding to the printing command signal by selectively operating the FET, which is a switching element, and a heater according to the printing command signal received through the FPC board. An inkjet printer, a duplicating machine, etc., are examples of printing machines that may be used with the present invention, which will now be described with the use of an inkjet printer according to the following.

Referring to FIG. 2A and FIG. 2B, the FPC board 200 of the present invention includes a plurality of voltage supplying terminals 210, a plurality of grounded terminals 220, a plurality of signaling terminals 230, a plurality of first cables 215, and a plurality of second cables 225. In the drawing, the first cable 215 connected with the voltage supplying terminal 210 is represented by a slant line and the second cable 225 connected with the grounded terminal 220 is represented by a dotted line.

Also, the voltage supplying terminal 210 is represented by P (power), the grounded terminal 220 by G (ground), and the signaling terminal by S (signal).

For example, the voltage supplying terminal 210 represented by 'Y 2-P' means that the voltage supplying terminal is connected to the second side of the printer head 250, supplying a relevant voltage if a printing command signal for discharging ink of yellow color is received, and the grounded terminal 220 represented by 'Y 2-G' is a grounding terminal forming a predetermined yellow color group together with 'Y 2-P'.

The first cable 215 is a wiring electrically connecting the voltage supplying terminal 210 and the first bonding pad 252 of the printer head 250. Namely, the first cable 215 delivers an operating voltage, provided from the connected voltage supplying terminal 210, to a relevant heater 256 through the first bonding pad 252.

The second cable 225 is a wiring electrically connecting the grounded terminal 220 to the second bonding pad 254 of the printer head 250. A wiring (not shown) connecting the signaling terminal 230 to the printer head 250 will be omitted.

One end of each of the first and the second cables 215, 225 bonded on the first and the second bonding pads 252, 254, respectively, is called a lead. The lead is formed by coating exposed surfaces of the first and the second cables 215, 225, made of copper, using a material such as gold.

The voltage supplying terminal 210 selectively supplies an operating voltage to the heater 256, formed on the printer head 250 of FIG. 2B, through the first cable 215 depending on whether a printing command signal received from the inkjet printer is present (the signal transmission mechanism is not shown). For example, if a printing command signal is received in the voltage supplying terminal Y 2-P 210, the only heater 256 electrically connected to the voltage supplying terminal Y 2-P 210, in which a printing command signal is received, discharges relevant ink in response to the printing command signal and the voltage supplying terminal Y 2-P 210.

The grounded terminal 220 is a terminal grounding the FPC board 200, and at least one grounded terminal 220 is provided for each voltage supplying terminal 210. Namely, one voltage supplying terminal 210 and at least one grounded terminal 220 form a group for each color, and are operated together. The signaling terminal 230 performs a relevant function according to the controlling signal received from the inkjet printer.

One side of each of the voltage supplying terminal 210, grounded terminal 220, and signaling terminal 230, is plated for electrically contacting the inkjet printer. This plated part is called a dimple.

Figure 3:
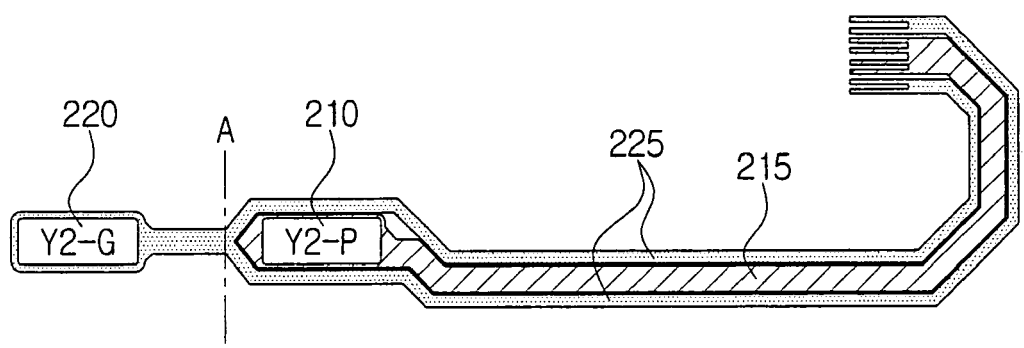
FIG. 3 is a drawing showing one voltage supplying terminal and one grounded terminal provided in FIG. 2A.
Figure 4:
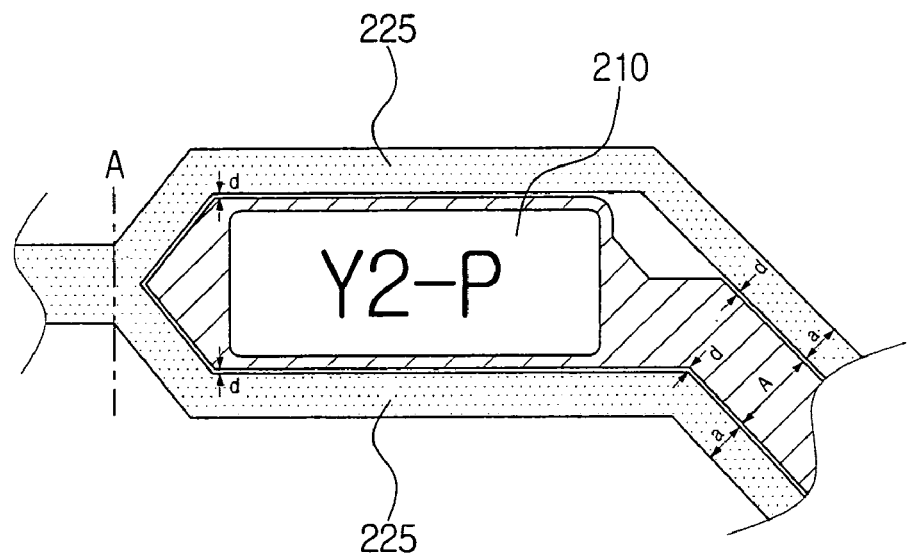
FIG. 4 is an enlarged view of the voltage supplying terminal, and a part of the first and the second cables as shown in FIG. 3.

FIG. 3 is a drawing showing one voltage supplying terminal and one grounded terminal provided in FIG. 2A, and FIG. 4 is an enlarged view of the voltage supplying terminal, and a part of the first and the second cables, as shown in FIG. 3.

Referring to FIG. 3 and FIG. 4, the second cable 225, connected to the grounded terminal 220, is divided into at least two portions in its predetermined position, for example at a position indicated by a one-dotted line 'A' of FIG. 3, and is provided in parallel along both sides of the first cable 215 connected to the voltage supplying terminal 210. That is, the second cable 225 is divided into at least two portions in its predetermined position 'A', and the at least two portions are provided along the first cable 215 in the length direction. The first portion of the at least two portions is provided along one side of the first cable 215, and the second portion is provided along the other side of the first cable 215. In other words, the first and second portions of the at least two divided portions of the second cable 225 are provided opposite to each other with respect to the first cable 215, i.e., provided at left and right sides of the first cable 215, respectively.

In this embodiment, the provided at least two portions of the second cable 225 are separated a predetermined distance 'd' from both sides of the first cable 215. This predetermined distance is preferably 30 μm–500 μm.

Also, it is preferable that the leads of the first and the second cables 215, 225 are divided into two portions and bonded on the first and the second bonding pads 252, 254, respectively. By such construction of division into at least two portions, the leads are parallel-connected, whereby resistance is reduced and if one of contact points (namely, one of the divided leads) is shorted, the other contact point (the lead among the divided leads that is not shortened) could be used. Therefore, the life of the FPC board 200 could also be extended.

Referring to FIG. 2B again, the printer head 250 is provided to a part represented by a dotted line in FIG. 2A, and electrically connected to the FPC board 200.

The printer head 250, which discharges ink, is provided at one side of the ink cartridge, and has a plurality of the first and the second bonding pads 252, 254 and a plurality of heaters 256. A description and drawing of the FET element, etc., provided to the printer head 250, will be omitted.

A plurality of the first and second bonding pads 252, 254 are distributed and provided to both sides of the printer head 250, i.e., the first side and the second side. In the present invention, the first side is the portion closer to the at least one voltage supplying terminal 210 than the second side. The first and the second bonding pads 252, 254, made of aluminum, are terminals which are bonded to the leads of the first and the second cables 215, 225, respectively, by ultrasonic fusing.

A plurality of heaters 256 is divided according to each color, and discharges ink if an operating voltage is applied from the connected voltage supplying terminal 210.

If the ink cartridge, in which the FPC board 200 and the printer head are combined, is electrically connected to a printer cartridge in the inside of the inkjet printer by a dimple, the printer head 250 discharges ink according to a printing command signal received from the inkjet printer by the FPC board 200.

If the printing command signal is received from the inkjet printer, the voltage supplying terminal 210 (e.g. Y 2-P) of the FPC board 200, corresponding to a color of the received printing command signal, operates the heater 256 on the printer head 250 by forming a group (e.g. Y 2) together with at least one grounded terminal 220 (e.g. Y 2-G).

In the group Y 2, 'Y' stands for a group discharging yellow ink, and '2' means that the group Y 2 is connected to the second side of the printer head 250 by the first and the second cables 215, 225.

Figure 5:
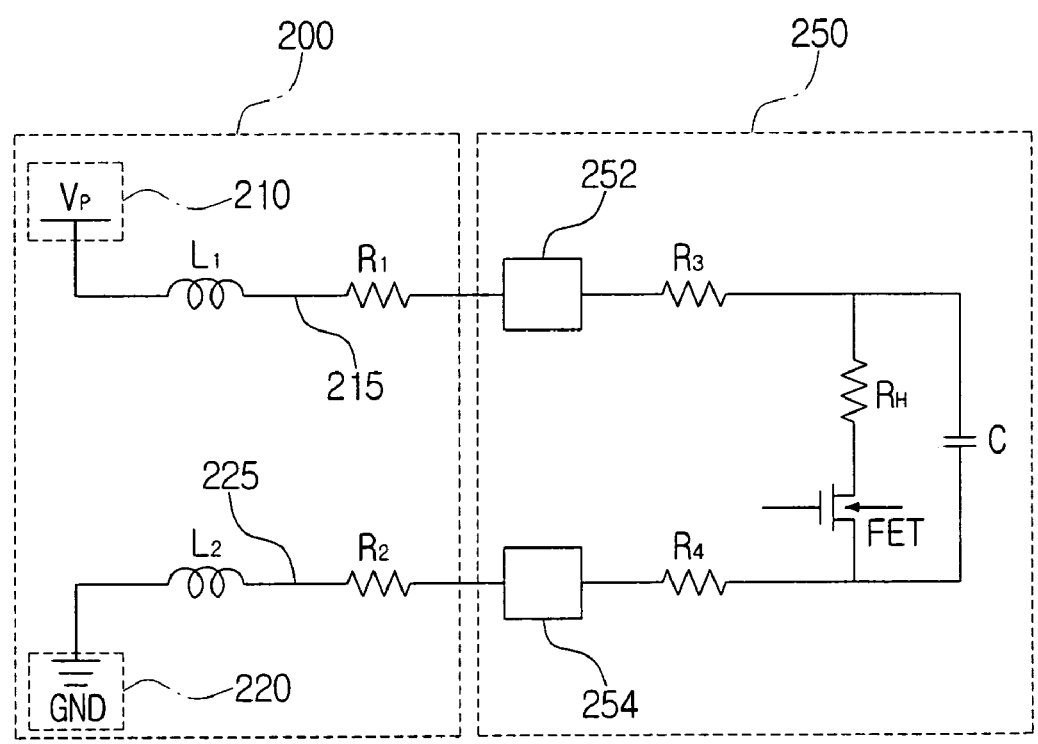
FIG. 5 is a circuit diagram showing a part of FPC board connected with a printer head of FIG. 2.

FIG. 5 is a circuit diagram showing a part of the FPC board 200 connected with the printer head 250 as shown in FIG. 2.

Referring to FIG. 5, the leads of the first and the second cables 215, 225 of the FPC board 200 are bonded on the first and the second bonding pads 252, 254, respectively. In this embodiment, if a printing command signal is received from the inkjet printer, the heater 256 represented by RH is heated by a predetermined voltage supplying terminal Vp 210 and a turn-on of a switching element represented by the FET. Accordingly, ink is discharged through the heater 256. The circuit is grounded by a predetermined grounded terminal GND 220. In the meantime, the FPC board 200 connected with the printer head 250 has an impedance as shown in the following equation.

$$Z = R + \omega L + \frac{1}{\omega C} \quad \text{Equation 1}$$

Referring to the Equation 1, Z stands for impedance, R stands for the resultant resistance of $R_1$ through $R_4$, L stands for the resultant inductance of $L_1$ and $L_2$, C stands for capacitance, and ω stands for angular velocity. The impedance Z is formed by a resistor R, an inductor L, and a capacitor C as is shown by the Equation 1. As the impedance Z gets small, signaling from the FPC board 200 to the printer head 250, and the operating voltage, is swiftly transferred and supplied. Such impedance Z is most greatly influenced by the inductance L with respect to data transmission frequency.

Table 2 shows inductance values measured at the FPC board 200 connected with the printer head 250 of FIG. 2.

TABLE 2

| Color | Inductance (unit: nH) |
| --- | --- |
| Y1 | 5.9 |
| Y2 | 14.9 |
| M1 | 14.1 |

TABLE 2-continued

| Color | Inductance (unit: nH) |
|---|---|
| M2 | 16.6 |
| C1 | 11.4 |
| C2 | 13.8 |

Referring to Table 2, Y is a group for realizing yellow, M for magenta, C for cyan, and 1, 2 in the 'color' block indicates that color groups Y, M, C are connected to the first side and the second side of the printer head 250, respectively.

Also, Y1 includes one voltage supplying terminal Y1-P and one grounded terminal Y1-G, and Y2 includes one voltage supplying terminal Y2-P and one grounded terminal Y2-G. As constructions of M1, M2, C1, C2 are similar to those of Y1, Y2, a detailed description thereof will be omitted.

The inductance values as represented by Table 2 are values measured for the case that the width 'A' of the first cable 215 is twice the width 'a' of the second cable 225, and the separation distance 'd' between the first and the second cables 215, 225 is 60 μm–100 μm.

In the foregoing case, the inductance formed in the group for each color of the FPC board has the minimum value of 5.9 nH, and the maximum value of 16.6 nH. As such inductance is proportional to the separating distance 'd', the inductance could be reduced by reduction of the separation distance 'd' between the first and the second cables 215, 225.

As the impedance formed in a plurality of the first and the second cables 215, 225 is reduced as described, the FPC board 200 swiftly supplies the current necessary for operating the FET element to the printer head 250, and voltage and current loss is reduced, whereby a high printing speed is accomplished.

In the meantime, as shown in the above Table 2, even in the case of a group for realizing the same color, inductance values measured at the first and the second sides of the printer head 250 are different each other, because the wiring lengths connected to the first and the second side ends are different each other. The different inductance values could be adjusted by adjustment of the separation distance 'd' between the first and the second cables 215, 225.

More specifically, in the FPC board 200 according to the present invention, it is preferable that the separation distance 'd' between the first and the second cables 215, 225 connected to the first side of the printer head 250, and the separation distance 'd' between the first and the second cables 215, 225 connected to the second side end of the printer head 250, are different from each other.

Namely, as the first side is positioned closer to the at least one voltage supplying terminal 210 than the second side, the separation distance 'd' between the first and the second cables 215, 225 connected to the first side end of the printer head 250 is larger than the separation distance 'd' between the first and the second cables 215, 225 connected to the second side end of the printer head 250.

In other words, the separation distance 'd' of the part having a large inductance value is reduced so that the inductance value is reduced, while the separation distance 'd' of the part having a small inductance value is increased so that the inductance value is increased.

As described, adjustment of the inductance value by the adjustment of the separation distance 'd' contributes to an improvement of the printing quality. For example, in the case that the FPC board 200 is connected with the printer head 250, if a printing command signal for operating the heaters 256 positioned at the first and the second sides of the printer head 250 is applied from the inkjet printer, the inductance value is adjusted so that impedance values of the first and the second sides are the same, whereby the heaters 256 positioned at the first and the second sides could be operated simultaneously. Accordingly, the two heaters 256 positioned at different positions simultaneously discharge inks of different or the same color, thereby improving the printing quality.

Meanwhile, in the FPC board 200 according to the present invention, it is also possible to provide a plurality of second cables 225 at right and left sides of the first cable 215. For example, the inductance value can also be reduced by providing one among three second cables 225 along the left side of the first cable 215, while providing the remaining two second cables 225 along the right side of the first cable 215.

According to the flexible printed circuit board of the present invention, the grounding cables are provided along both sides of the cable supplying voltage to the printer head, so that the inductance formed in the flexible printed circuit board is reduced. Therefore, the whole impedance formed on the flexible printed circuit board is also reduced and the flexible printed circuit board supplies the necessary current to the printer head, without a short in the cables, in a high frequency condition, thereby improving printing speed. Also, the inductance value is adjusted through the adjustment of the distance between the grounding cable and the cable supplying voltage to the printer head, so that the printing quality is improved.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A flexible printed circuit board connected to a printer head having at least one heater discharging ink, the flexible printed circuit board comprising:
at least one voltage supplying terminal selectively supplying an operating voltage to the at least one heater in response to receiving a printing command signal from a printer;
at least one first cable connected at each end to the at least one voltage supplying terminal and a first bonding pad, of a plurality of bonding pads, respectively, transferring the operating voltage to the at least one heater;
at least one grounded terminal; and
at least one second cable connected at each end to the at least one grounded terminal and at least one second bonding pad, of the plurality of bonding pads, respectively, wherein the at least one second cable is divided into at least two portions at a predetermined position and a first portion of the at least two divided portions is provided along one side of the at least one first cable, and a second portion of the at least two divided portions is provided along the other side of the first cable, with the first and second portions connecting to the second bonding pad.

2. The flexible printed circuit board according to claim 1, wherein the ends of the at least one first and second cables connected to the at least one first and second bonding pads, respectively, are each divided into at least two portions connected to the respective bonding pads.

3. The flexible printed circuit board according to claim 1, wherein the at least one first and second bonding pads are comprised of aluminum.

4. The flexible printed circuit board according to claim 1, wherein the at least one first and second cables are bonded to the at least one first and second bonding pads, respectively, by ultrasonic fusing.

5. A printer having the printer head connected to the flexible printed circuit board of claim 1 to transfer signals to the printer head to use in printing.

6. A flexible printed circuit board connected to a printer head having at least one heater discharging ink, the flexible printed circuit board comprising:
   at least one voltage supplying terminal selectively supplying an operating voltage to the at least one heater in response to receiving a printing command signal from a printer;
   at least one first cable connected at each end to the at least one voltage supplying terminal and at least one first bonding pad, respectively, transferring the operating voltage to the at least one heater;
   at least one grounded terminal; and
   at least one second cable connected at each end to the at least one grounded terminal and at least one second bonding pad, respectively, wherein the at least one second cable is divided into at least two portions at a predetermined position and a first portion of the at least two divided portions is provided alone one side of the at least one first cable, and a second portion of the at least two divided portions is provided along the other side of the first cable,
   wherein a distance between the first cable and the first portion, and a distance between the first cable and the second portion, are 30 µm–300 µm, respectively.

7. A flexible printed circuit board connected to a printer head having at least one heater discharging ink, the flexible printed circuit board comprising:
   at least one voltage supplying terminal selectively supplying an operating voltage to the at least one heater in response to receiving a printing command signal from a printer;
   at least one first cable connected at each end to the at least one voltage supplying terminal and at least one first bonding pad, respectively, transferring the operating voltage to the at least one heater;
   at least one grounded terminal; and
   at least one second cable connected at each end to the at least one grounded terminal and at least one second bonding pad, respectively, wherein the at least one second cable is divided into at least two portions at a predetermined position and a first portion of the at least two divided portions is provided along one side of the at least one first cable, and a second portion of the at least two divided portions is provided alone the other side of the first cable,
   wherein in response to the first and the second bonding pads being distributed in a predetermined ratio and provided to a first side and a second side facing the first side on a printer head substrate, a separating distance between the first and the second cables connected to the first and the second bonding pads on the first side is different from a separating distance between the first and the second cables connected to the first and the second bonding pads on the second side.

8. A flexible printed circuit board connected to a printer head having at least one heater discharging ink, the flexible printed circuit board comprising:
   at least one voltage supplying terminal selectively supplying an operating voltage to the at least one heater in response to receiving a printing command signal from a printer;
   at least one first cable connected at each end to the at least one voltage supplying terminal and at least one first bonding pad, respectively, transferring the operating voltage to the at least one heater;
   at least one grounded terminal; and
   at least one second cable connected at each end to the at least one grounded terminal and at least one second bonding pad, respectively, wherein the at least one second cable is divided into at least two portions at a predetermined position and a first portion of the at least two divided portions is provided along one side of the at least one first cable, and a second portion of the at least two divided portions is provided along the other side of the first cable,
   wherein the ends of the at least one first and second cables connected to the at least one first and second bonding pads, respectively, are coated with a second material other than a first material which comprises the cables.

9. The flexible printed circuit board according to claim 8, wherein the first material is copper and the second material is gold.

10. A flexible printed circuit board connected to a printer head having at least one heater discharging ink, the flexible printed circuit board comprising:
    at least one voltage supplying terminal selectively supplying an operating voltage to the at least one heater in response to receiving a printing command signal from a printer;
    at least one first cable connected at each end to the at least one voltage supplying terminal and at least one first bonding pad, respectively, transferring the operating voltage to the at least one heater;
    at least one grounded terminal; and
    at least one second cable connected at each end to the at least one grounded terminal and at least one second bonding pad, respectively, wherein the at least one second cable is divided into at least two portions at a predetermined position and a first portion of the at least two divided portions is provided along one side of the at least one first cable, and a second portion of the at least two divided portions is provided along the other side of the first cable,
    wherein one side of each of the at least one voltage supplying terminal and the at least one grounded terminal is plated to electrically contact the printer.

11. A flexible printed circuit board connected to a printer head having at least one heater discharging ink, the flexible printed circuit board comprising:
    at least one voltage supplying terminal selectively supplying an operating voltage to the at least one heater in response to receiving a printing command signal from a printer;
    at least one first cable connected at each end to the at least one voltage supplying terminal and at least one first bonding pad, respectively, transferring the operating voltage to the at least one heater;
    at least one grounded terminal; and
    at least one second cable connected at each end to the at least one grounded terminal and at least one second bonding pad, respectively, wherein the at least one second cable is divided into at least two portions at a predetermined position and a first portion of the at least two divided portions is provided along one side of the at least one first cable, and a second portion of the at least two divided portions is provided along the other side of the first cable, wherein an inductance is reduced by reduction of the predetermined distance separating the at least one first and second cables.

12. A flexible printed circuit board connected to a printer head, comprising:

a voltage connection line, of a plurality of voltage connection lines, supplying voltage to a first contact on the printer head; and a grounding connection line, of a plurality of grounding connection lines, providing grounding to a second contact on the printer head;

wherein the grounding connection line is divided into at least two portions, both to connect to the second contact, and which are provided in parallel along both sides of the voltage connection lines, separated from the voltage connection lines by a predetermined distance.

13. A printer having the printer head connected to the flexible printed circuit board of claim 12 to transfer signals to the printer head to use in printing.

14. A flexible printed circuit board connected to a printer head, comprising:

voltage connection lines supplying voltage to the printer head; and grounding connection lines providing grounding to the printer head;

wherein the grounding connection lines are each divided into at least two portions, and are provided in parallel along both sides of the respective voltage connection lines, separated from the voltage connection lines by a predetermined distance, wherein an impedance formed on the flexible printed circuit board is adjusted by adjusting the predetermined distance between the grounding connection lines and the voltage connection lines.

15. A flexible printed circuit board connected to a printer head, comprising:

voltage connection lines supplying voltage to the printer head; and grounding connection lines providing grounding to the printer head;

wherein the grounding connection lines are each divided into at least two portions, and are provided in parallel along both sides of the respective voltage connection lines, separated from the voltage connection lines by a predetermined distance, wherein leads of the voltage and grounding connection lines connecting the connection lines to the printer head are each divided into at least two portions, and the at least two portions are bonded to the printer head.

* * * * *

UNITED STATES PATENT AND TRADEMARK OFFICE
CERTIFICATE OF CORRECTION

| | | |
|---|---|---|
| PATENT NO. | : 7,040,739 B2 | Page 1 of 1 |
| APPLICATION NO. | : 10/706953 | |
| DATED | : May 9, 2006 | |
| INVENTOR(S) | : Jeong-Seon Kim et al. | |

It is certified that error appears in the above-identified patent and that said Letters Patent is hereby corrected as shown below:

Column 9, Line 28, after "provided" change "alone" to --along--.

Column 9, Line 54, after "provided" change "alone" to --along--.

Column 11, Line 18, change "lines" to --line--.

Column 11, Line 19, change "lines" to --line--.

Signed and Sealed this

Twenty-first Day of November, 2006

JON W. DUDAS
*Director of the United States Patent and Trademark Office*